(12) United States Patent
Matsuda et al.

(10) Patent No.: US 6,639,536 B2
(45) Date of Patent: Oct. 28, 2003

(54) DIGITAL-ANALOG CONVERTER

(75) Inventors: Atsushi Matsuda, Kawasaki (JP); Tohru Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/361,625

(22) Filed: Feb. 11, 2003

(65) Prior Publication Data
US 2003/0151537 A1 Aug. 14, 2003

(30) Foreign Application Priority Data
Feb. 14, 2002 (JP) .................................. 2002-037349

(51) Int. Cl.⁷ .................................................. H03M 1/78
(52) U.S. Cl. .................................... 341/154; 341/144
(58) Field of Search ............................ 341/154, 144, 341/145, 148, 150

(56) References Cited

U.S. PATENT DOCUMENTS 5,731,774 A * 3/1998 Fujii et al. .................. 341/144
6,486,817 B1 * 11/2002 Okada et al. ............... 341/154

* cited by examiner

Primary Examiner—Brian Young
Assistant Examiner—Joseph Lauture
(74) Attorney, Agent, or Firm—Arent Fox Kintner Plotkin & Kahn PLLC

(57) ABSTRACT

First and second switches are connected at each node between adjacent resistors in a resistor row and at the end of the resistor row. A predetermined number of first switches are grouped together and short-circuited to obtain a plurality of first switch groups, and a predetermined number of second switches are grouped together and short-circuited to obtain a plurality of second switch groups. The first and second switch groups are connected to output terminals via output switches. The first and second switches are ON/OFF controlled such that only one switch in the first and second switch groups is connected to the resistance row.

18 Claims, 11 Drawing Sheets

DIGITAL-ANALOG CONVERTER

CROSS-REFERENCE TO RELATED APPLICATIONS

This application is based upon and claims the benefit of priority from the prior Japanese Patent Application No. 2002-37349, filed on Feb. 14, 2002, the entire contents of which are incorporated herein by reference.

BACKGROUND OF THE INVENTION

1) Field of the Invention

The present invention relates to a digital-analog converter (DAC) used in the analog integrated circuits or the analog-digital hybrid integrated circuits.

2) Description of the Related Art

A conventional resistance-division type DAC is shown in FIG. 1. This DAC includes resistors R0, R1, . . . , and Rj, and switches SW0, SW1, . . . , and SWj, where j is a natural number. The resistors R0, R1, . . . , and Rj are connected in series (resistor row). One terminal of each of the switches SW0, SW1, . . . , and SWj is connected to a node between two adjacent resistors and the other terminal is connected to one terminal of the first resistor R0. The other terminal of the first switch R0 is connected to ground potential. A power source applies a voltage VDD to one terminal of the last resistor Rj. The switches are ON/OFF controlled based on an input code, which is not shown, to obtain a resistance-divided voltage of the voltage VDD at an output terminal dout.

Sometimes more than one DAC's are necessary in the integrated circuits. In that case, desired number of DAC's having the structure shown in FIG. 1 can be used, or one DAC can be provided and the resistor row of that DAC can be shared to construct other DAC's.

FIG. 2 shows a twofold DAC in which a resistor row of one DAC is shared by other DAC. This twofold DAC includes series connected resistors R0, R1, R2, . . . , Rj, switches SW01, SW11, SW21, . . . , SWj1, and SW02, SW12, SW22, . . . , SWj2. One terminal of each of the switches SW01 and SW02, SW11 and SW12, . . . , and SWj1 and SWj2, is connected to a node between two adjacent resistors and the other terminal is connected to one terminal of the first resistor R0. The rest of the structure of the twofold DAC is the same as that of the DAC shown in FIG. 1. The switches SW01, SW11, SW21, . . . , SWj1 are ON/OFF controlled based on a first input code, the switches SW02, SW12, SW22, . . . , SWj2 are ON/OFF controlled based on a second input code. As a result, first and second resistance-divided voltages of the voltage VDD are output from first and second output terminals dout1 and dout2 respectively. The first and the second input codes have not been shown in the diagram. A threefold DAC or even a multifold DAC can be constructed in a similar manner as the twofold DAC.

Consider that many DAC's having the structure shown in FIG. 1 are used in the integrated circuit. In that case, since the DAC's occupy a large area, the size of the integrated circuit will disadvantageously increase.

Now consider that a multifold DAC (e.g., a twofold DAC shown in FIG. 2) is used in the integrated circuit. In that case, the number of the switches becomes very large. For example, consider an m-fold resistance-division type DAC of n bits, where n and m are natural numbers. In this DAC, $2^n$ resistors and $m \times 2^n$ switches will be required. For the sake of convenience, the manner in which the resistors and the switches are connected in a multifold DAC will be called "simple multifolding."

SUMMARY OF THE INVENTION

It is an object of this invention to provide a multifold DAC that can be realized with lesser switches.

According to a first aspect of the present invention, a multifold DAC has the following structure. When n is an even number, the multifold DAC has a resistor row that has $2^n$ resistors connected in series. One switch is connected to the end terminal of this resistor row and to each node between adjacent resistors respectively. These $2^n$ switches will be called a first switch group. Nodes x0 to $x(2^n-1)$ that are not connected to the resistor row of the switches that are included in the first switch group, are short-circuited by $2^{n/2}$. The node group having the nodes short-circuited by $2^{n/2}$ will be called a first node group. Then, the first node group consists of $2^{n/2}$ nodes.

One more switch is also connected to the end terminal of the resistor row and to each node between adjacent resistors respectively. These $2^n$ switches will be called a second switch group. Nodes y0 to $y(2^n-1)$ that are not connected to the resistor row of the switches that are included in the second switch group, are also short-circuited by $2^{n/2}$. Regarding the nodes y0 to $y(2^n-1)$, the node group having the nodes short-circuited by $2^{n/2}$ will be called a second node group. Then, the second node group also consists of $2^{n/2}$ nodes. Each node group included in the first node group and the second node group is connected to two to five different output terminals via mutually independent switches. The switches included in the first switch group and the second switch group are ON/OFF controlled according to a plurality of input codes such that each node group included in the first node group and the second node group is not connected to the resistor row at two or more positions.

In the first aspect, when n is an odd number, the first node group has the nodes x0 to $x(2^n-1)$ short-circuited by $2^{(n+1)/2}$, and the first node group consists of $2^{(n-1)/2}$ nodes. The second node group has the nodes y0 to $y(2^n-1)$ short-circuited by $2^{(n-1)/2}$, and the second node group consists of $2^{(n+1)/2}$ nodes.

According to the first aspect of the invention, it is possible to share one resistor row with the DACs by using a smaller number of switches than the number of DACs according to a simple multifolding.

According to a second aspect of the invention, a multifold DAC has the following structure. When n is an even number, the multifold DAC has a resistor row that has $2^n$ resistors connected in series. One switch is connected to the end terminal of this resistor row and to each node between adjacent resistors respectively. These $2^n$ switches will be called a first switch group. Nodes x0 to $x(2^n-1)$ that are not connected to the resistor row of the switches that are included in the first switch group, are disposed in a matrix shape of $2^{n/2} \times 2^{n/2}$. A switch is connected between adjacent nodes. A plurality of switches provided between these nodes will be called a second switch group.

Nodes disposed corresponding to a first side of the outermost periphery among the node groups disposed in the matrix shape are connected to a first output terminal via mutually independent switches. Nodes disposed corresponding to a second side of the outermost periphery are connected to a second output terminal via mutually independent switches. Nodes disposed corresponding to a third side of the outermost periphery are connected to a third output terminal via mutually independent switches. Nodes disposed corresponding to a fourth side of the outermost periphery are connected to a fourth output terminal via mutually independent switches. The switches included in the second switch group are ON/OFF controlled according to a plurality of input codes such that a route short-circuited by the first output terminal, a route short-circuited by the second output terminal, a route short-circuited by the third output terminal, and a route short-circuited by the fourth output terminal are not mutually short-circuited.

In the second aspect, when n is an odd number, the nodes x0 to x($2^n-1$) are disposed in a matrix shape of $2^{(n+1)/2} \times 2^{(n-1)/2}$.

According to the second aspect, it is possible to share one resistor row with the DACs by using a smaller number of switches than the number of DACs according to a simple multifolding.

These and other objects, features and advantages of the present invention are specifically set forth in or will become apparent from the following detailed descriptions of the invention when read in conjunction with the accompanying drawings.

DETAILED DESCRIPTIONS

The embodiments of the multifold DAC relating to the present invention will be explained in detail below with reference to the accompanying drawings. A four-bit resistance-division type multifold DAC will be considered here; however, the number of bits is not particularly limited to four.

Figure 3:
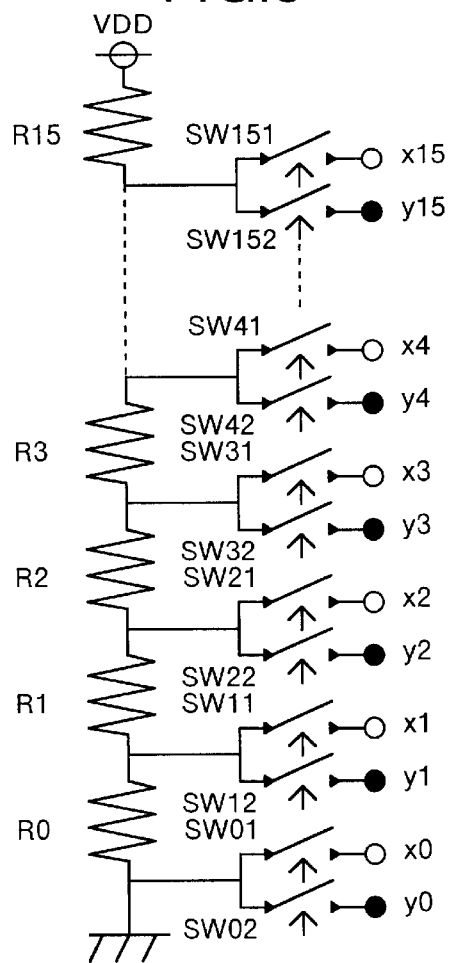
FIG. 3 is a schematic diagram of a multifold DAC relating to a first embodiment of the present invention.
Figure 4:
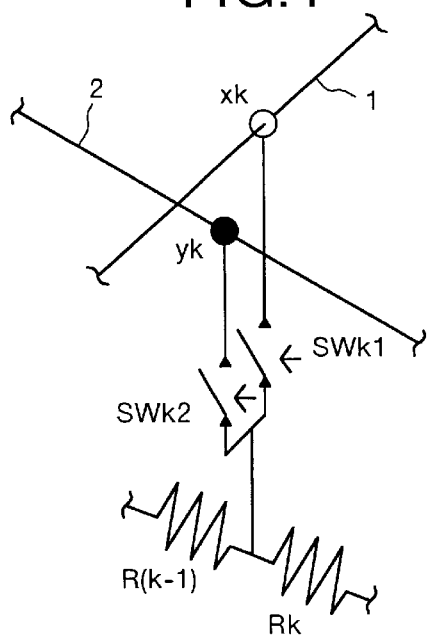
FIG. 4 is a detail schematic diagram of two corresponding switches among the switches shown in FIG. 3.
Figure 5:
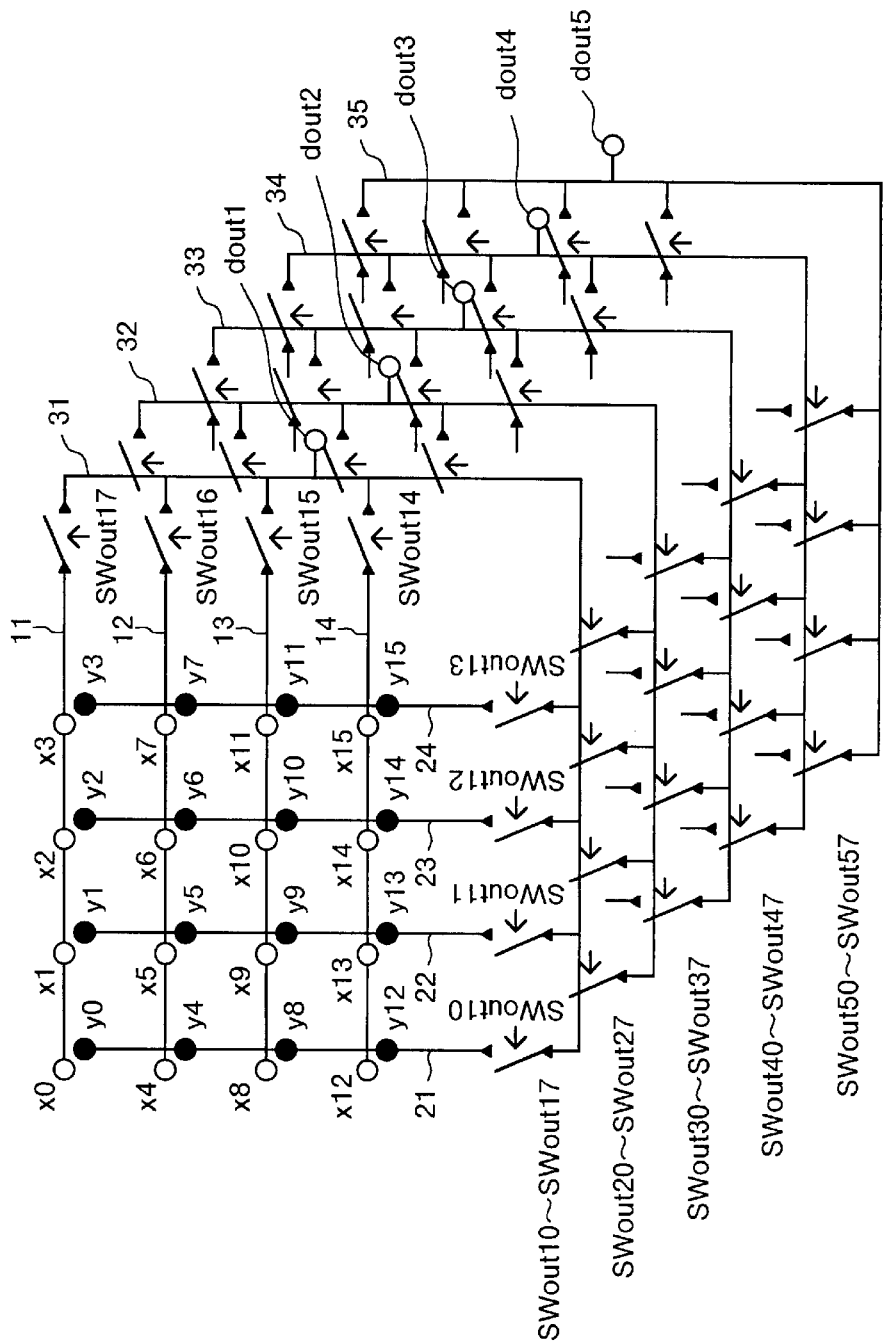
FIG. 5 is a detail schematic diagram of the switches shown in FIG. 3.

FIG. 3 to FIG. 5 explain a structure of a multifold DAC relating to a first embodiment of the present invention. FIG. 3 is a schematic diagram that shows how switches are connected to the resistor row. This multifold DAC includes 16 series connected resistors R0, R1, . . . , and R15, and a pair of switches connected to a node between adjacent two resistors and to one terminal of the first resistor R0. Precisely, SW01 and SW02 are connected to the one terminal of the first resistor R0, switches SW11 and SW12 to a node between switches R0 and R1, switches SW21 and SW22 to a node between switches R1 and R2, and so on. Thus, there are total 32 switches.

The other terminals of the switches SW01 to SW152 will be numbered as explained below. The terminals the switches SW01 and SW02 will be called x0 and y0 respectively. Terminals of the switches SWk1 and SWk2, where k is a natural number from 1 to 15, which are connected to the node between resistors R(k–1) and Rk, will be called xk and yk respectively. In FIG. 3 to FIG. 6, the terminals (nodes) x0, x1, . . . , x15 are expressed as white circles, and the terminals (nodes) y0, y1, . . . , y15 are expressed as black circles.

FIG. 4 shows in detail how the switches, for example, SWk1 and SWk2, which are connected to a node between resistors R(k–1) and Rk, are connected to the wires. A node xk is connected to a wire 1, and a node yk is connected to wire 2. Wires 1 and 2 are electrically insulated.

FIG. 5 is a schematic diagram which shows a connection relation between the switches shown in FIG. 3. As shown in FIG. 5, four nodes of x0, x1, x2, and x3 are short-circuited by a first x-side wiring 11. Four nodes of x4, x5, x6, and x7 are short-circuited by a second x-side wiring 12. Four nodes of x8, x9, x10, and x11 are short-circuited by a third x-side wiring 13. Four nodes of x12, x13, x14, and x15 are short-circuited by a fourth x-side wiring 14.

Four nodes of y0, y4, y8, and y12 are short-circuited by a first y-side wiring 21. Four nodes of y1, y5, y9, and y13 are short-circuited by a second y-side wiring 22. Four nodes of y2, y6, y10, and y14 are short-circuited by a third y-side wiring 23. Four nodes of y3, y7, y11, and y15 are short-circuited by a fourth y-side wiring 24.

The above thirty-two switches SW01 to SW152 that are connected to the resistor row are suitably ON/OFF controlled according to codes that are input to the DAC. These switches are controlled such that two or more nodes are not connected to the resistor row at the same time, out of the four nodes x0, x1, x2, and x3. This similarly applies to the node group of x4, x5, x6, and x7, the node group of x8, x9, x10, and x11, the node group of x12, x13, x14, and x15, the node group of y0, y4, y8, and y12, the node group of y1, y5, y9, and y13, the node group of y2, y6, y10, and y14, and the node group y3, y7, y11, and y15, respectively. In other words, the switches are controlled such that two or more nodes are not connected to the resistor row at the same time, out of each of these node groups respectively.

The first y-side wiring 21, the second y-side wiring 22, the third y-side wiring 23, the fourth y-side wiring 24, the fourth x-side wiring 14, the third x-side wiring 13, the second x-side wiring 12, and the first x-side wiring 11 are connected to a first output wiring 31, via a first output switch SWout 10, a second output switch SWout 11, a third output switch SWout 12, a fourth output switch SWout 13, a fifth output switch SWout 14, a sixth output switch SWout 15, a seventh output switch SWout 16, and an eighth output switch SWout 17, respectively. A first output terminal dout1 is connected to the first output wiring 31.

The first to fourth y-side wirings 21 to 24 and the fourth to first x-side wirings 14 to 11 are connected respectively to a second output wiring 32 that is connected to a second output terminal dout2, via a ninth output switch SWout 20, a tenth output switch SWout 21, an eleventh output switch SWout 22, a twelfth output switch SWout 23, a thirteenth output switch SWout 24, a fourteenth output switch SWout 25, a fifteenth output switch SWout 26, and a sixteenth output switch SWout 27, respectively.

The first to fourth y-side wirings 21 to 24 and the fourth to first x-side wirings 14 to 11 are connected respectively to a third output wiring 33 that is connected to a third output terminal dout3, via a seventeenth output switch SWout 30, an eighteenth output switch SWout 31, a nineteenth output switch SWout 32, a twentieth output switch SWout 33, a twenty-first output switch SWout 34, a twenty-second output switch SWout 35, a twenty-third output switch SWout 36, and a twenty-fourth output switch SWout 37, respectively.

The first to fourth y-side wirings 21 to 24 and the fourth to first x-side wirings 14 to 11 are connected respectively to a fourth output wiring 34 that is connected to a fourth output terminal dout4, via a twenty-fifth output switch SWout 40, a twenty-sixth output switch SWout 41, a twenty-seventh output switch SWout 42, a twenty-eighth output switch SWout 43, a twenty-ninth output switch SWout 44, a thirtieth output switch SWout 45, a thirty-first output switch SWout 46, and a thirty-second output switch SWout 47, respectively.

The first to fourth y-side wirings 21 to 24 and the fourth to first x-side wirings 14 to 11 are connected respectively to a fifth output wiring 35 that is connected to a fifth output terminal dout5, via a thirty-third output switch SWout 50, a thirty-fourth output switch SWout 51, a thirty-fifth output switch SWout 52, a thirty-sixth output switch SWout 53, a thirty-seventh output switch SWout 54, a thirty-eighth output switch SWout 55, a thirty-ninth output switch SWout 56, and a fortieth output switch SWout 57, respectively.

The above forty output switches SWout 10 to SWout 57 are suitably ON/OFF controlled according to codes that are input to the DAC. In FIG. 5, in order to avoid complex expression of the diagram, the notation of "SWout **" (where * is a number) is omitted for the ninth to fortieth output switches SWout 20 to SWout 57.

Figure 6:
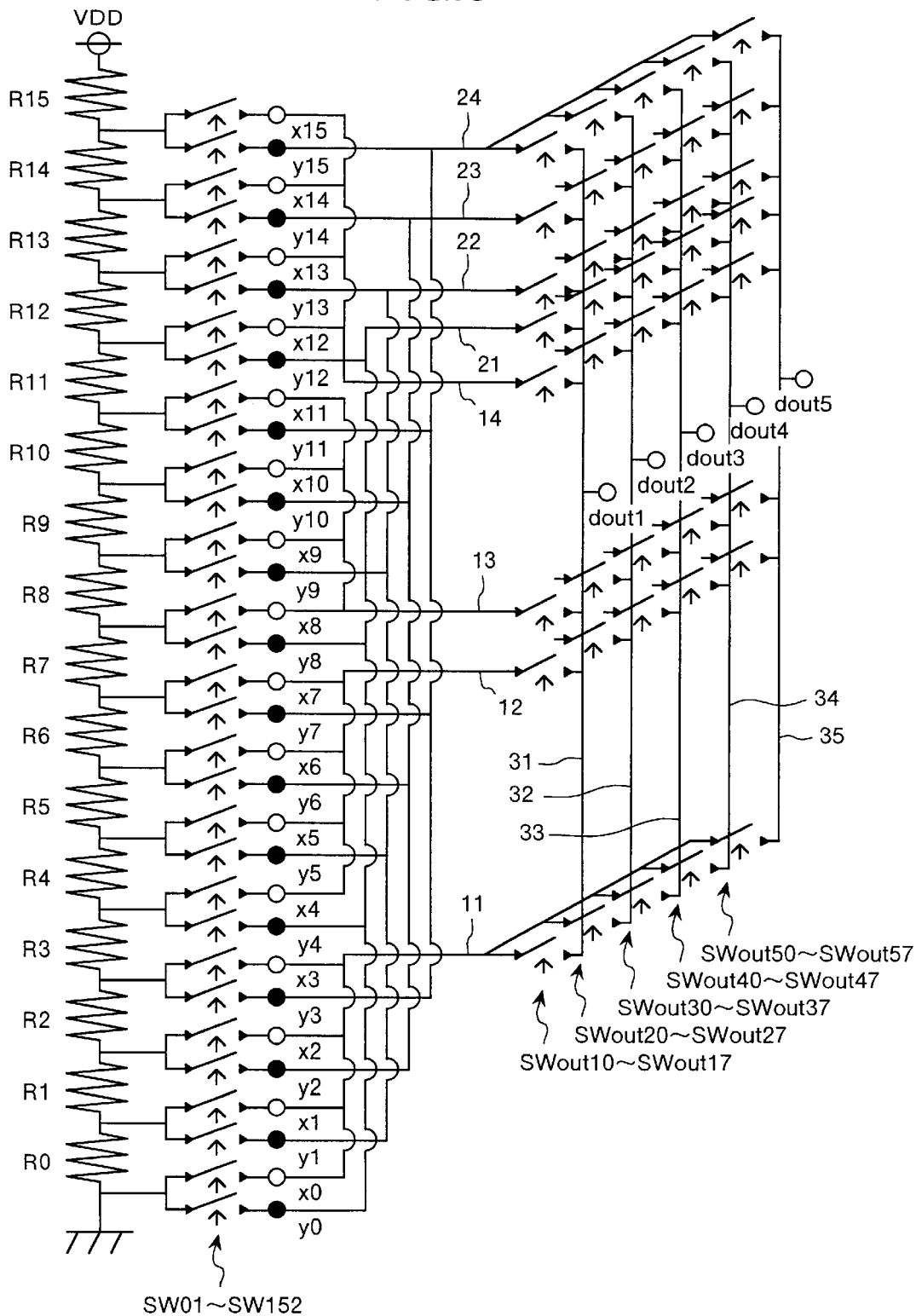
FIG. 6 shows circuit configuration of the DAC relating to the first embodiment.

FIG. 6 shows a total circuit configuration of a fivefold DAC prepared by using four-bit resistance-division type DACs. The structure shown in FIG. 6 has an integrated structure of the structures shown in FIG. 3 to FIG. 5.

This will be explained based on examples. When the input codes are of a fivefold of 5, 6, 9, 10, and 11, switches SW51, SW62, SW92, SW101, and SW112 corresponding to five nodes x5, y6, y9, x10, and y11 are in the ON state and the other switches are in the OFF state, out of thirty-two switches SW01 to SW152 that are connected to the resistor row, as shown in FIG. 7.

When the switch SW61 is turned ON instead of the switch SW62, the node x6 is connected to the resistor row instead of the node y6. Then, a second x-side wiring 12 is connected to the resistor row at two node positions, which is not desirable. Therefore, in the first embodiment, the switch ON/OFF control is carried out such that when the node x5 is connected to the resistor row, other wiring that does not include the node x5 is connected to the resistor row. In other words, a third y-side wiring 23 that includes the node y6 is connected to the resistor row.

A seventh output switch SWout 16 that is connected to the second x-side wiring 12 becomes in the ON state, and a voltage (5 VDD/16) corresponding to an input code 5 is obtained from a first output terminal dout1. Then, an eleventh output switch SWout 22, an eighteenth output switch SWout 31, a thirtieth output switch SWout 45, and a thirty-sixth output switch SWout 53 become in the ON state. Other output switches are in the OFF state. As a result, a voltage (6 VDD/16) corresponding to the input code 6, a voltage (9 VDD/16) corresponding to the input code 9, a voltage (10 VDD/16) corresponding to the input code 10, and a voltage (11 VDD/16) corresponding to the input code 11 are obtained from the second output terminal dout2, the third output terminal dout3, the fourth output terminal dout4, and the fifth output terminal dout5 respectively.

Figure 7:
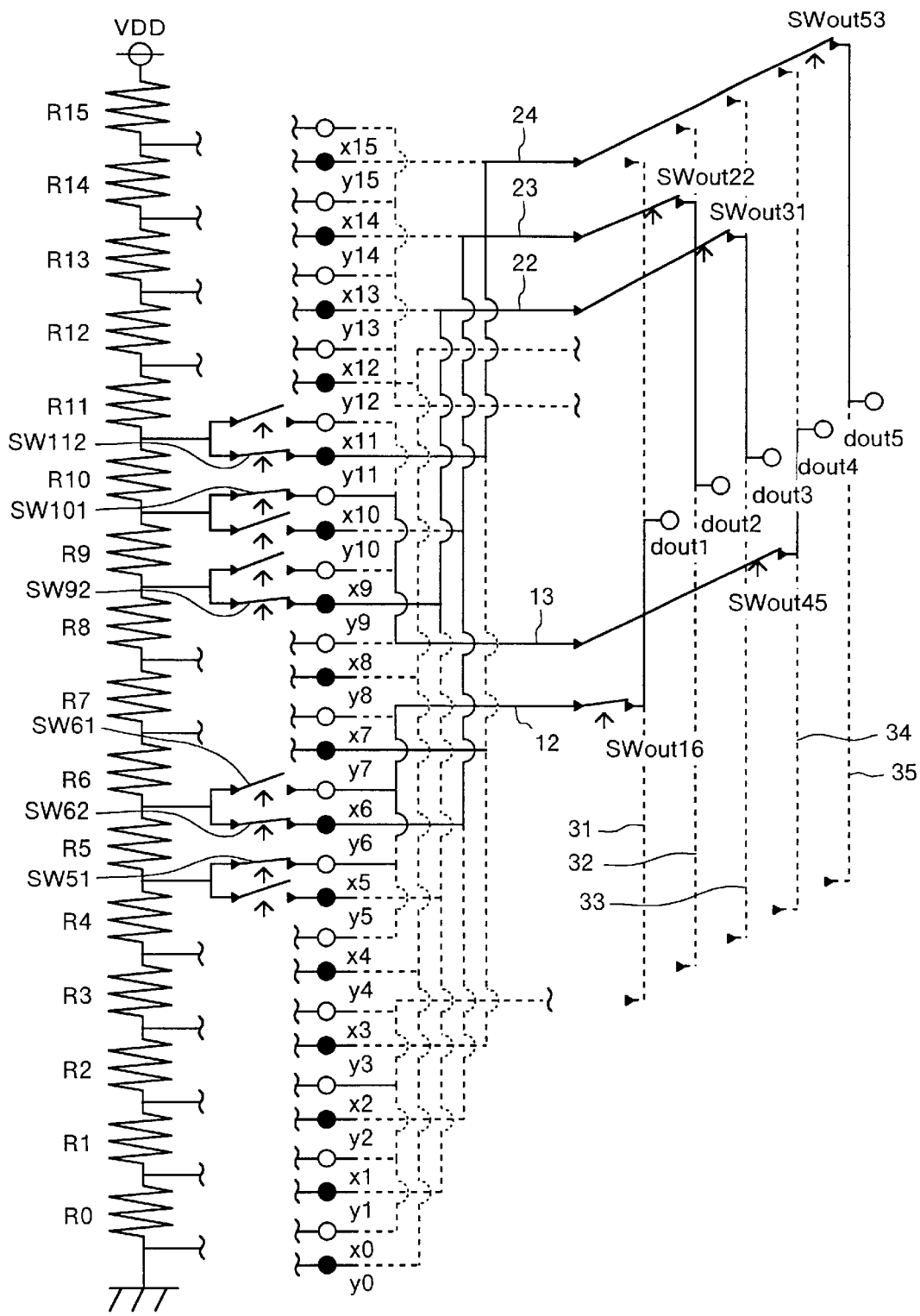
FIG. 7 is for explaining the operation of the DAC shown in FIG. 6.

In FIG. 7, a part of the switches, output switches and wiring is omitted respectively, in order to simplify the expression of the drawing. Wiring portions, that are not connected to the resistor row as the switches are in the OFF state, are shown by broken lines.

The number of bits of the DAC is not limited to four. When the number of bits of the DAC is n (where n is a natural number), and when n is an even number, a node group consisting of $2^{n/2}$ nodes prepared by short-circuiting $2^n$ nodes of x0 to x($2^n$-1) by $2^{n/2}$, and a node group consisting of $2^{n/2}$ nodes prepared by short-circuiting $2^n$ nodes of y0 to y($2^n$-1) by $2^{n/2}$ may be connected to output terminals dout1, dout2, dout3, dout4, and dout5 via output switches respectively.

On the other hand, when n is an odd number, a node group consisting of $2^{(n-1)/2}$ nodes prepared by short-circuiting $2^n$ nodes of x0 to x($2^n$-1) by $2^{(n+1)/2}$, and node group consisting of $2^{(n+1)/2}$ nodes prepared by short-circuiting $2^n$ nodes of y0 to y($2^n$-1) by $2^{(n-1)/2}$ may be connected to output terminals dout1, dout2, dout3, dout4, and dout5 via output switches respectively.

While the structures shown in FIG. 5 and FIG. 6 are in a fivefold DAC structure respectively, the fifth output wiring 35 becomes unnecessary when the DACs are in fourfold. When the DACs are in threefold, the fourth and fifth output wirings 34 and 35 are not necessary. When the DACs are in twofold, the third to fifth output wirings 33 to 35 are not necessary. The number of switches that are connected to the end terminal of the resistor row and to each node between adjacent resistors respectively may be three or four. When the number of switches is three, it is possible to obtain twofold to tenfold DACs by employing a wiring structure that is similar to that when the number of switches is two. When the number of switches is four, it is possible to obtain twofold to eighteenfold DACs. In general, when k switches are connected to the end terminal of the resistor row and to each node between adjacent resistors respectively, a maximum multifold number becomes $k^2$+int (k/2), where int denotes a round-off function for rounding off a decimal point or below, and k denotes an integer of two or above.

Figure 1:
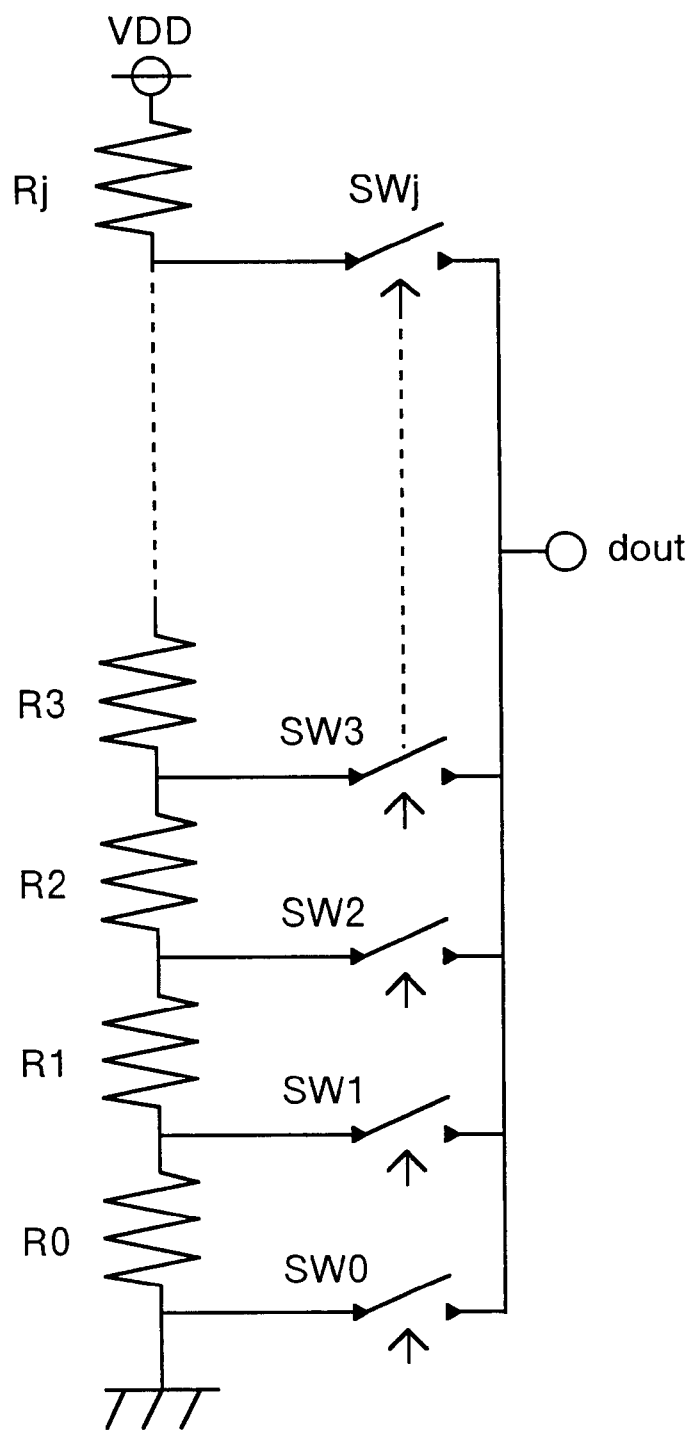
FIG. 1 is a schematic diagram of a structure of a conventional resistance-division type DAC.
Figure 2:
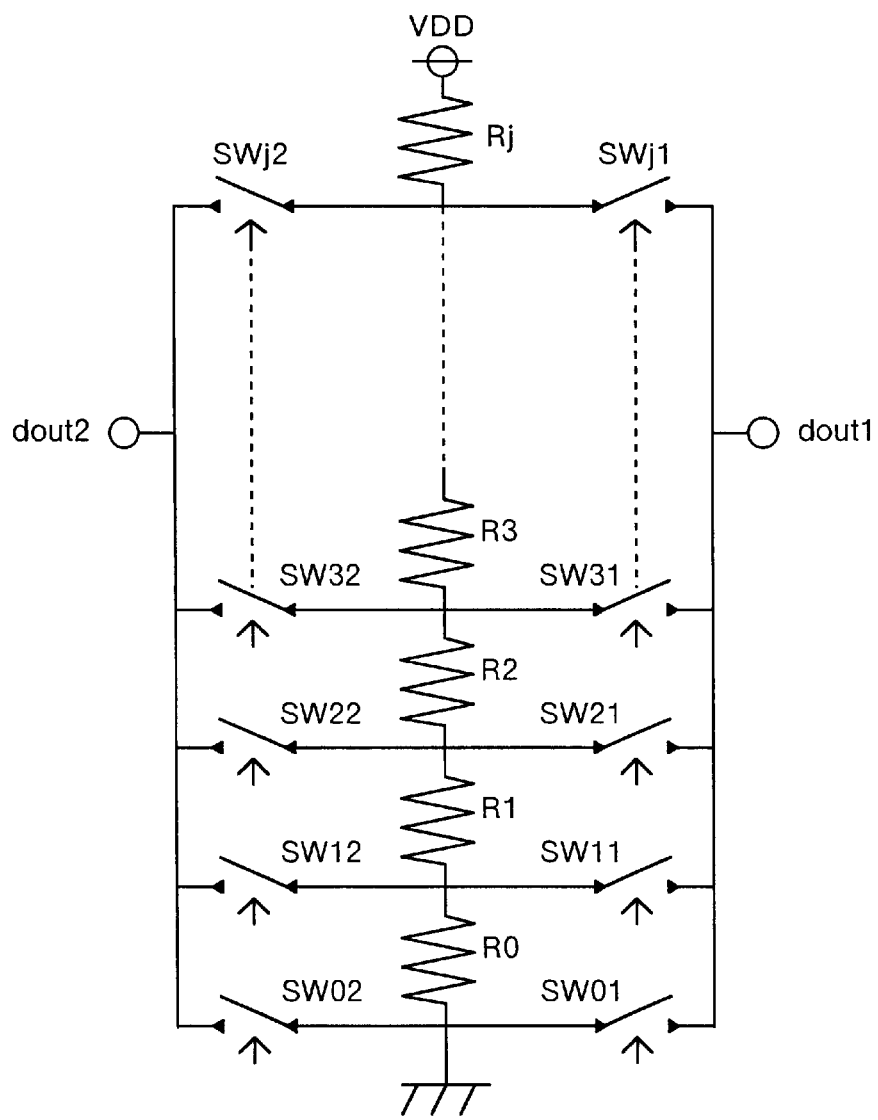
FIG. 2 is a schematic diagram of a structure of a twofold DAC.
Figure 12:
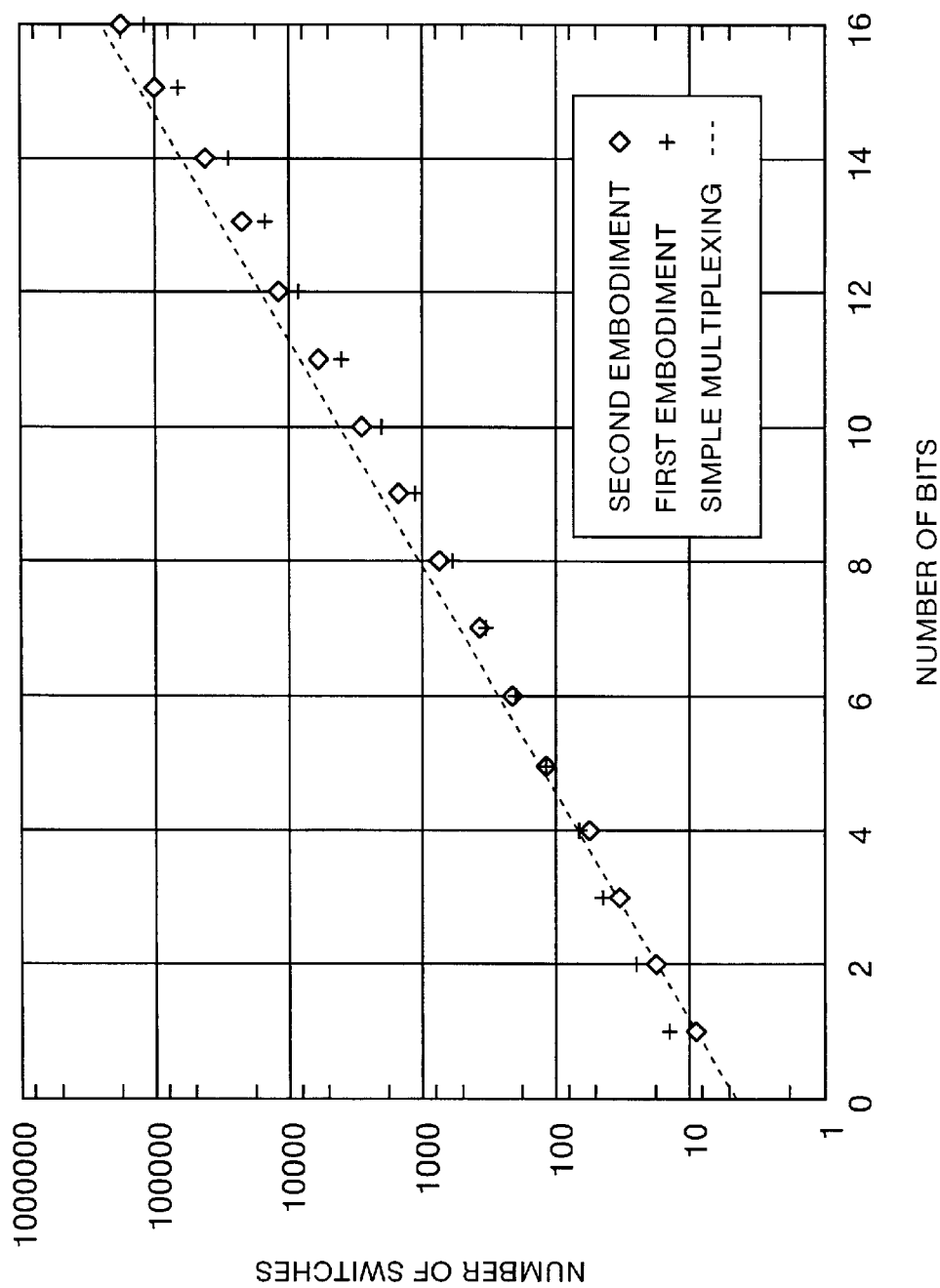
FIG. 12 is a graph that explains a relation between the number of switches and the number of bits in the DAC's of the present invention and those in the conventional multifold DAC shown in FIG. 2.

FIG. 12 is a graph which shows a relation between the necessary number of switches (including the above-described output switches) and the number of bits of a DAC necessary for the DAC, for the fourfold DAC of the first embodiment s an example and the fourfold DAC having a simple multifold structure shown in FIG. 2 respectively. It is clear from FIG. 12 that when the number of bits is five or more, the number of switches becomes smaller in the first embodiment. When the number of folds is expressed as m and the number of bits of the DAC is expressed as n, the total number of necessary switches (including the output switches) becomes ($2 \times 2^n + m \times 2 \times 2^{n/2}$), when n is an even number. The total number of necessary switches becomes ($2 \times 2^n + m \times (2^{(n+1)/2} + 2^{(n-1)/2})$), when n is an odd number.

According to the above first embodiment, it is possible to obtain a multifold DAC that uses a smaller number of switches than that of a simplex multifold DAC, by connecting two switches to the end terminal of the resistor row and to each node between adjacent resistors respectively, and by connecting these switches in the manner as described above.

Figure 8:
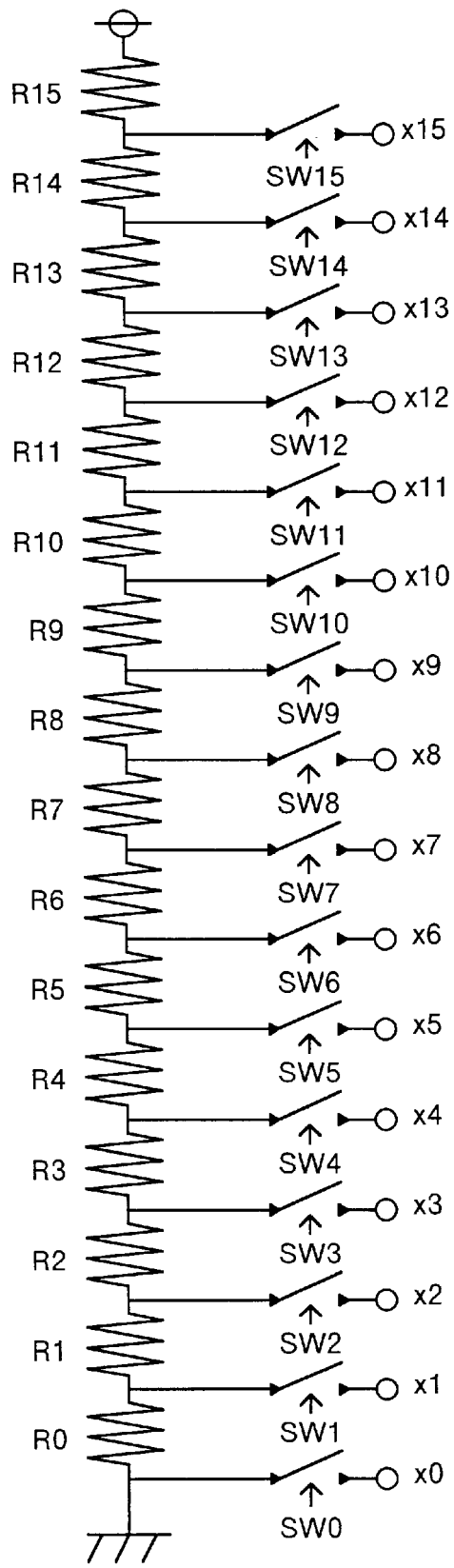
FIG. 8 is a schematic diagram of a multifold DAC relating to a second embodiment of the present invention.
Figure 9:
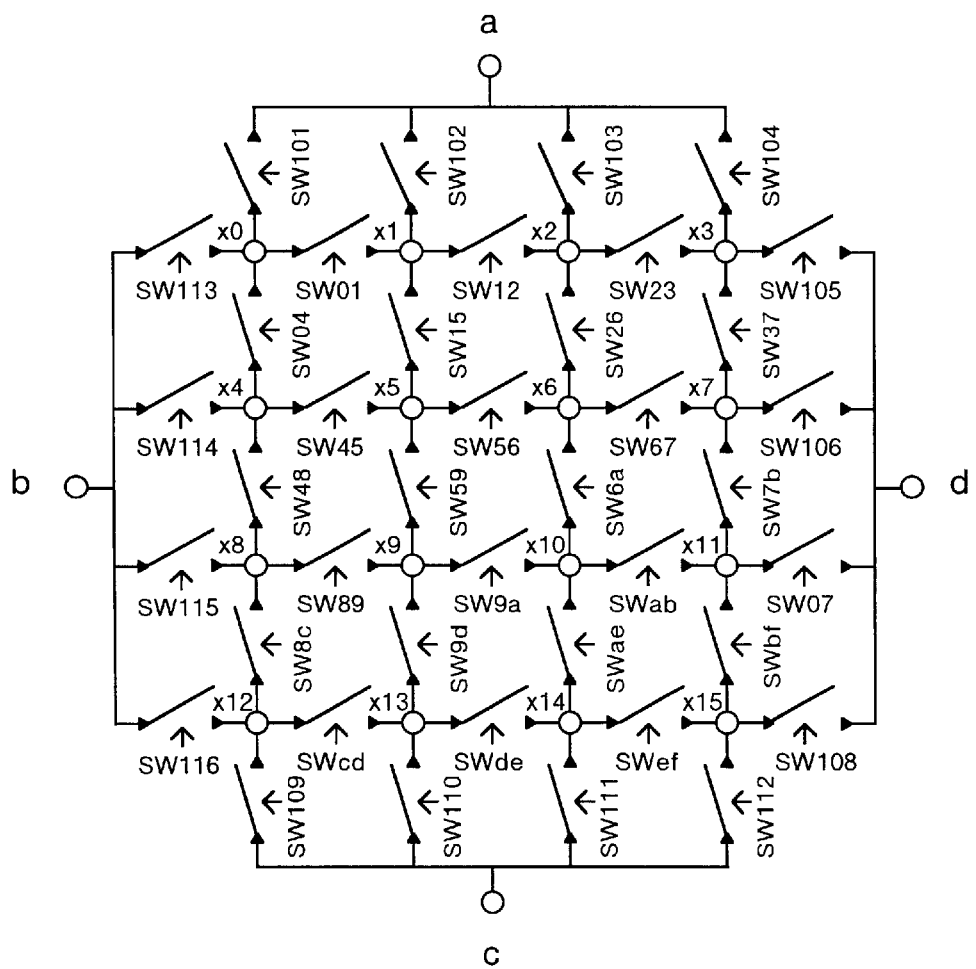
FIG. 9 is a detail schematic diagram of the switches shown in FIG. 8.
Figure 10:
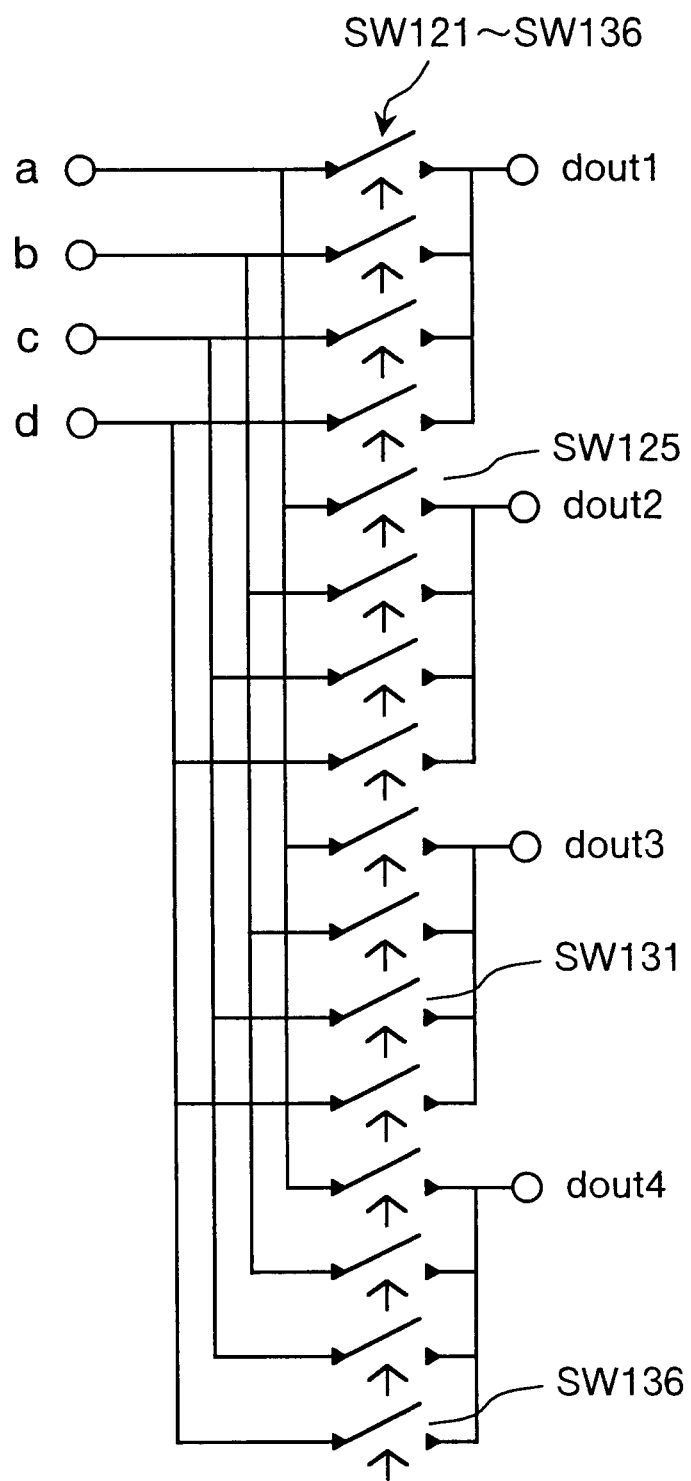
FIG. 10 is a schematic diagram of output stages of the multifold DAC relating to the second embodiment.

FIG. 8 to FIG. 10 are diagrams which explain a multifold DAC structure relating to a second embodiment of the present invention. FIG. 8 is a schematic diagram which shows a total connection relation of switches to a resistor row. As shown in FIG. 8, sixteen resistors R0, R1, ... , and R15 are connected in series, and one of switches SW0, SW1, ... , and SW15 is connected respectively to a node between adjacent resistors and to the end terminal of the resistor row. Nodes of switches that are not connected to the resistor row of the sixteen switches SW0 to SW15 are expressed as x0 to x15.

FIG. 9 is a schematic diagram which shows a connection relation between the switches shown in FIG. 8. As shown in FIG. 9, the sixteen nodes x0 to x15 are disposed in a matrix shape of 4×4. For example, four nodes x0, x1, x2, and x3 are arranged in the first row. Four nodes x4, x5, x6, and x7 are arranged in the second row. Four nodes x8, x9, x10, and x11 are arranged in the third row. Four nodes x12, x13, x14, and x15 are arranged in the fourth row.

Switches are provided between adjacent nodes. For example, switches SW01, SW12, and SW23 are provided between the node x0 and the node x1, between the node x1 and the node x2, and between the node x2 and the node x3, respectively. Switches SW45, SW56, and SW67 are provided between the node x4 and the node x5, between the node x5 and the node x6, and between the node x6 and the node x7, respectively. Switches SW89, SW9a, and SWab are provided between the node x8 and the node x9, between the node x9 and the node x10, and between the node x10 and the node x11, respectively. Switches SWcd, SWde, and SWef are provided between the node x12 and the node x13, between the node x13 and the node x14, and between the node x14 and the node x15, respectively.

Further, switches SW04, SW15, SW26, and SW37 are provided between the node x0 and the node x4, between the node x1 and the node x5, between the node x2 and the node x6, and between the node x3 and the node x7, respectively. Switches SW48, SW59, SW6a, and SW7b are provided between the node x4 and the node x8, between the node x5 and the node x9, between the node x6 and the node x10, and between the node x7 and the node x11, respectively. Switches SW8c, SW9d, SWae, and SWbf are provided between the node x8 and the node x12, between the node x9 and the node x13, between the node x10 and the node x14, and between the node x11 and the node x15, respectively.

The nodes x0, x1, x2, and x3 that are disposed to correspond to one side of the outermost periphery are connected in common to an output node a via switches SW101, SW102, SW103, and SW104 respectively. The nodes x3, x7, x11, and x15 that are disposed to correspond to other one side of the outermost periphery are connected in common to an output node d via switches SW105, SW106, SW107, and SW108 respectively. The nodes x12, x13, x14, and x15 that are disposed to correspond to still other one side of the outermost periphery are connected in common to an output node c via switches SW109, SW110, SW111, and SW112 respectively. The nodes x0, x4, x8, and x12 that are disposed to correspond to still other one side of the outermost periphery are connected in common to an output node b via switches SW113, SW114, SW115, and SW116 respectively.

FIG. 10 is a schematic diagram which shows a structure of output stages of the multifold DAC relating to the second embodiment of the present invention. As shown in FIG. 10, the above four output nodes a to d are connected to a first output terminal dout1, a second output terminal dout2, a third output terminal dout3, and a fourth output terminal dout4, via switches SW121, SW122, ... , and SW136, respectively. In the matrix shown in FIG. 9, depending on the routes of switches that are in the ON state, voltages that are output from the output nodes a, b, c, and d are not necessarily corresponding to the voltages output from the first to fourth output terminals dout1, dout2, dout3, and dout4 respectively. Therefore, the structure shown in FIG. 10 adjusts this relationship.

The above will be explained based on examples. When the four input codes are a fourfold of 5, 6, 9, and 10, four example, the switches SW5, SW6, SW9, and SW10 corresponding to the nodes x5, x6, x9, and x1 become in the ON state, and other switches become in the OFF state, out of the sixteen switches SW0 to SW15 shown in FIG. 8.

Figure 11:
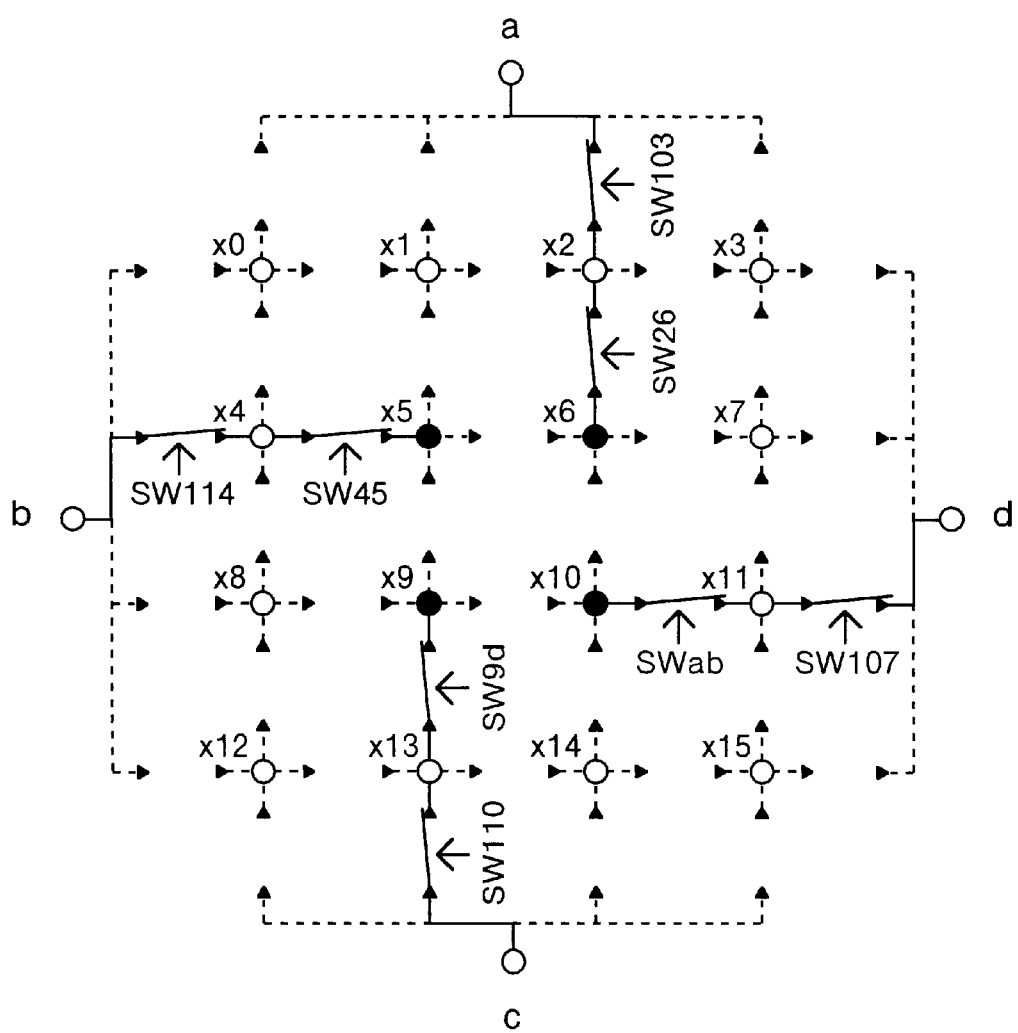
FIG. 11 is a diagram which explains the operation of the DAC shown in FIG. 9.

Then, as shown in FIG. 11, the switch SW45 and the switch SW114 become in the ON state, and the node x5 is short-circuited by the output node b. The switch SW26 and the switch SW103 become in the ON state, and the node x6 is short-circuited by the output node a. The switch SW9d and the switch SW110 become in the ON state, and the node x9 is short-circuited by the output node c. Further, the switch SWab and the switch SW107 become in the ON state, and the node x10 is short-circuited by the output node d. As explained above, the switches are ON/OFF controlled such that the four routes that are short-circuited by the output nodes a to d are not short-circuited by each other.

Out of the sixteen switches SW121 to SW136 shown in FIG. 10, the switch SW122 becomes in the ON state, and the output node b is connected to the first output terminal dout1. As a result, a voltage (5 VDD/16) that corresponds to an input code 5 is obtained from the first output terminal dout1. The switch SW125 becomes in the ON state, and the output node a is connected to the second output terminal dout2. As a result, a voltage (6 VDD/16) that corresponds to an input code 6 is obtained from the second output terminal dout2.

Further, the switch SW131 becomes in the ON state, and the output node c is connected to the third output terminal dout3. As a result, a voltage (9 VDD/16) that corresponds to an input code 9 is obtained from the third output terminal dout3. The switch SW136 becomes in the ON state, and the output node d is connected to the fourth output terminal dout4. As a result, a voltage (10 VDD/16) that corresponds to an input code 10 is obtained from the fourth output terminal dout4. Other switches are in the OFF state.

In FIG. 11, a part of the switches is omitted, in order to simplify the expression of the drawing. Wiring portions, that are not connected to the resistor row as the switches, are in the OFF state are shown by broken lines.

The number of bits of the DAC is not limited to four. When the number of bits of the DAC is n, and when n is an even number, $2^n$ nodes of x0 to x($2^n-1$) may be arrayed in a matrix shape of $2^{n/2} \times 2^{n/2}$, and the nodes disposed corresponding to each side of the outermost periphery may be connected to the output nodes a to d via the switches. On the other hand, when n is an odd number, $2^n$ nodes of x0 to x($2^n-1$) may be arrayed in a matrix shape of $2^{(n+1)/2} \times 2^{(n-1)/2}$, and the nodes disposed corresponding to each side of the outermost periphery may be connected to the output nodes a to d via the switches. While the structure shown in FIG. 9 is in a fourfold structure, the output node d becomes unnecessary when the DACs are in a threefold structure, and the output nodes c and d become unnecessary when the DACs are in a twofold structure.

FIG. 12 shows a relation between the necessary number of switches and the number of bits of the fourfold DAC of the above-described second embodiment as an example. It is clear from FIG. 12 that when the number of bits is four or more, the number of switches becomes smaller in the second embodiment than in the simple multifold DAC.

According to the above second embodiment, it is possible to obtain a multifold DAC that uses a smaller number of switches than that of a simplex multifold DAC, by connecting one switch to the end terminal of the resistor row and to each node between adjacent resistors respectively, by disposing the other ends of these switches in a matrix shape, and by connecting the other ends of adjacent switches by the switch together.

As explained above, according to the present invention, it is possible to share one resistor row with a plurality of DACs by using a smaller number of switches than the number of DACs according to a simple multifolding. Therefore, it is possible to obtain a multifold DAC by using a smaller number of switches than the number of DACs according to a simple multifolding.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A digital-analog converter of an n-bit resistance-division type that has a resistor row including a series connected $2^n$ resistors, where n is an even number, the digital-analog converter comprising:

a first switch group including $2^n$ switches, each switch having two terminals, wherein one terminal of one switch is connected to the end terminal of the resistor row and one terminal of each of the remaining switches is connected to each node between two adjacent resistors in the resistor row;

a second switch group including $2^n$ switches, each switch having two terminals, wherein one terminal of one switch is connected to the end terminal of the resistor row and one terminal of each of the remaining switches is connected to each node between two adjacent resistors in the resistor row;

a first node group, comprising $2^{n/2}$ nodes, formed by short-circuiting $2^{n/2}$ of the terminals of the switches in the first switch group that have not been connected to the resistor row;

a second node group, comprising $2^{n/2}$ nodes, formed by short-circuiting $2^{n/2}$ of the terminals of the switches in the second switch group that have not been connected to the resistor row;

a first output terminal;

a second output terminal;

a first output switch that connects the nodes in the first node group to the first output terminal;

a second output switch that connects the nodes in the second node group to the second output terminal; and a switch controller that controls ON/OFF of the switches in the first switch group and the second switch group based on an input code such that all the switches are OFF or only one switch is ON.

2. The digital-analog converter according to claim 1, further comprising:

a third switch group including $2^n$ switches, wherein one switch is connected to the end terminal of the resistor row and the remaining switches are connected to each node between two adjacent resistors in the resistor row, wherein a third node group has nodes not connected to the resistor row of the $2^n$ switches that are included in the third switch group short-circuited by a predetermined number like the first node group or the second node group, and is connected to the two output terminals via mutually independent switches respectively, and the switches included in the first switch group, the second switch group, and the third switch group are ON/OFF controlled according to input codes such that each node group is insulated from the resistor row or is connected to the resistor row at only one position.

3. The digital-analog converter according to claim 1, further comprising:

a third switch group including $2^n$ switches, wherein one switch is connected to the end terminal of the resistor row and the remaining switches are connected to each node between two adjacent resistors in the resistor row; and a fourth switch group including $2^n$ switches, wherein one switch is connected to the end terminal of the resistor row and the remaining switches are connected to each node between two adjacent resistors in the resistor row, wherein a third node group has nodes not connected to the resistor row of the $2^n$ switches that are included in the third switch group short-circuited by a predetermined number like the first node group or the second node group, and a fourth node group has nodes not connected to the resistor row of the $2^n$ switches that are included in the fourth switch group short-circuited by a predetermined number like the first node group or the second node group, and the third node group and the fourth node group are connected to the two output terminals via mutually independent switches respectively, and the switches included in the first switch group, the second switch group, the third switch group, and the fourth switch group are ON/OFF controlled according to input codes such that each node group is insulated from the resistor row or is connected to the resistor row at only one position.

4. The digital-analog converter according to claim 1, further comprising a third output terminal to which each node group is connected via mutually independent switches.

5. The digital-analog converter according to claim 1, further comprising a third output terminal and a fourth output terminal to which each node group is connected respectively via mutually independent switches.

6. The digital-analog converter according to claim 1, further comprising a third output terminal, a fourth output terminal, and a fifth output terminal to which each node group is connected respectively via mutually independent switches.

7. A digital-analog converter of an n-bit resistance-division type that has a resistor row including a series connected $2^n$ resistors, where n is an odd number, the digital-analog converter comprising:

a first switch group including $2^n$ switches, each switch having two terminals, wherein one terminal of one switch is connected to the end terminal of the resistor row and one terminal of each of the remaining switches is connected to each node between two adjacent resistors in the resistor row;

a second switch group including $2^n$ switches, each switch having two terminals, wherein one terminal of one switch is connected to the end terminal of the resistor row and one terminal of each of the remaining switches is connected to each node between two adjacent resistors in the resistor row;

a first node group, comprising $2^{(n-1)/2}$ nodes, formed by short-circuiting $2^{(n+1)/2}$ of the terminals of the switches in the first switch group that have not been connected to the resistor row;

a second node group, comprising $2^{(n+1)/2}$ nodes, formed by short-circuiting $2^{(n-1)/2}$ of the terminals of the switches in the second switch group that have not been connected to the resistor row;

a first output terminal;

a second output terminal; and a switch controller that controls ON/OFF of the switches in the first switch group and the second switch group based on an input code such that all the switches are OFF or only one switch is ON.

8. The digital-analog converter according to claim 7, further comprising:

a third switch group including $2^n$ switches, wherein one switch is connected to the end terminal of the resistor row and the remaining switches are connected to each node between two adjacent resistors in the resistor row, wherein a third node group has nodes not connected to the resistor row of the $2^n$ switches that are included in the third switch group short-circuited by a predetermined number like the first node group or the second node group, and is connected to the two output terminals via mutually independent switches respectively, and the switches included in the first switch group, the second switch group, and the third switch group are ON/OFF controlled according to input codes such that each node group is insulated from the resistor row or is connected to the resistor row at only one position.

9. The digital-analog converter according to claim 7, further comprising:

a third switch group including $2^n$ switches, wherein one switch is connected to the end terminal of the resistor row and the remaining switches are connected to each node between two adjacent resistors in the resistor row; and a fourth switch group including $2^n$ switches, wherein one switch is connected to the end terminal of the resistor row and the remaining switches are connected to each node between two adjacent resistors in the resistor row, wherein a third node group has nodes not connected to the resistor row of the $2^n$ switches that are included in the third switch group short-circuited by a predetermined number like the first node group or the second node group, and the fourth node group has nodes not connected to the resistor row of the $2^n$ switches that are included in the fourth switch group short-circuited by a predetermined number like the first node group or the second node group, and the third node group and the fourth node group are connected to the two output terminals via mutually independent-switches respectively, and the switches included in the first switch group, the second switch group, the third switch group, and the fourth switch group are ON/OFF controlled according to input codes such that each node group is insulated from the resistor row or is connected to the resistor row at only one position.

10. The digital-analog converter according to claim 7, further comprising a third output terminal to which each node group is connected via mutually independent switches.

11. The digital-analog converter according to claim 7, further comprising a third output terminal and a fourth output terminal to which each node group is connected respectively via mutually independent switches.

12. The digital-analog converter according to claim 7, further comprising a third output terminal, a fourth output terminal, and a fifth output terminal to which each node group is connected respectively via mutually independent switches.

13. A digital-analog converter of an n-bit resistance-division type that has a resistor row including a series connected $2^n$ resistors, where n is an even number, the digital-analog converter comprising:

a first switch group including $2^n$ switches, wherein one switch is connected to the end terminal of the resistor row and the remaining switches are connected to each node between two adjacent resistors in the resistor row;

a second switch group that consists of a plurality of switches connected between adjacent nodes, by having nodes that are not connected to the resistor row of the $2^n$ switches that are included in the switch group disposed in a matrix shape of $2^{n/2} \times 2^{n/2}$;

a first output terminal to which nodes disposed corresponding to a first side of the outermost periphery among the node groups disposed in the matrix shape are connected via mutually independent switches; and a second output terminal to which nodes disposed corresponding to a second side of the outermost periphery among the node groups are connected via mutually independent switches, wherein the switches included in the second switch group are ON/OFF controlled according to input codes such that a route short-circuited by the first output terminal and a route short-circuited by the second output terminal are mutually insulated.

14. The digital-analog converter according to claim 13, further comprising:

a third output terminal to which nodes disposed corresponding to a third side of the outermost periphery among the node groups disposed in the matrix shape are connected via mutually independent switches, wherein the switches included in the second switch group are ON/OFF controlled according to the input codes such that a route short-circuited by the first output terminal, a route short-circuited by the second output terminal, and a route short-circuited by the third output terminal are mutually insulated.

15. The digital-analog converter according to claim 13, further comprising:

a third output terminal to which nodes disposed corresponding to a third side of the outermost periphery among the node groups disposed in the matrix shape are connected via mutually independent switches; and a fourth output terminal to which nodes disposed corresponding to a fourth side of the outermost periphery among the node groups are connected via mutually independent switches, wherein the switches included in the second switch group are ON/OFF controlled according to the input codes such that a route short-circuited by the first output terminal, a route short-circuited by the second output terminal, a route short-circuited by the third output terminal, and a route short-circuited by the fourth output terminal are mutually insulated.

16. A digital-analog converter of an n-bit resistance-division type that has a resistor row including a series connected $2^n$ resistors, where n is an odd number, the digital-analog converter comprising:

a first switch group including $2^n$ switches, wherein one switch is connected to the end terminal of the resistor row and the remaining switches are connected to each node between two adjacent resistors in the resistor row;

a second switch group that consists of a plurality of switches connected between adjacent nodes, by having nodes that are not connected to the resistor row of the $2^n$ switches that are included in the switch group disposed in a matrix shape of $2^{(n+1)/2} \times 2^{(n-1)/2}$, a first output terminal to which nodes disposed corresponding to a first side of the outermost periphery among the node groups disposed in the matrix shape are connected via mutually independent switches; and a second output terminal to which nodes disposed corresponding to a second side of the outermost periphery among the node groups are connected via mutually independent switches, wherein the switches included in the second switch group are ON/OFF controlled according to a plurality of input codes such that a route short-circuited by the first output terminal and a route short-circuited by the second output terminal are mutually insulated.

17. The digital-analog converter according to claim 16, further comprising:

a third output terminal to which nodes disposed corresponding to a third side of the outermost periphery among the node groups disposed in the matrix shape are connected via mutually independent switches, wherein the switches included in the second switch group are ON/OFF controlled according to the input codes such that a route short-circuited by the first output terminal, a route short-circuited by the second output terminal, and a route short-circuited by the third output terminal are mutually insulated.

18. The digital-analog converter according to claim 16, further comprising:

a third output terminal to which nodes disposed corresponding to a third side of the outermost periphery among the node groups disposed in the matrix shape are connected via mutually independent switches; and a fourth output terminal to which nodes disposed corresponding to a fourth side of the outermost periphery among the node groups are connected via mutually independent switches, wherein the switches included in the second switch group are ON/OFF controlled according to the input codes such that a route short-circuited by the first output terminal, a route short-circuited by the second output terminal, a route short-circuited by the third output terminal, and a route short-circuited by the fourth output terminal are mutually insulated.

* * * * *